United States Patent [19]
Beaulieu et al.

[11] Patent Number: 5,882,413
[45] Date of Patent: Mar. 16, 1999

[54] SUBSTRATE PROCESSING APPARATUS HAVING A SUBSTRATE TRANSPORT WITH A FRONT END EXTENSION AND AN INTERNAL SUBSTRATE BUFFER

[75] Inventors: David Beaulieu, Groton; Michael W. Pippins, Hamilton, both of Mass.

[73] Assignee: Brooks Automation, Inc., Chelmsford, Mass.

[21] Appl. No.: 891,532

[22] Filed: Jul. 11, 1997

[51] Int. Cl.$^6$ .......................... C23C 16/00; B65G 49/07; H01L 21/00; B08B 7/00
[52] U.S. Cl. .......................... 118/719; 118/724; 118/725; 204/298.25; 204/298.26; 204/298.35; 414/935; 414/936; 414/937; 414/939; 134/1.1; 134/22.1; 156/345
[58] Field of Search .................... 118/719, 724, 118/725; 204/298.25, 298.26, 298.35; 414/935, 936, 937, 938, 939, 941; 408/905; 134/1.1, 1.2, 1.3, 22.1; 156/345

[56] References Cited

U.S. PATENT DOCUMENTS

| | | | |
|---|---|---|---|
| 4,293,249 | 10/1981 | Whelan | 406/72 |
| 5,002,010 | 3/1991 | Weinberg | 118/719 |
| 5,013,385 | 5/1991 | Maher et al. | 156/345 |
| 5,127,987 | 7/1992 | Okudaira et al. | 156/643 |
| 5,310,410 | 5/1994 | Begin et al. | 29/25.01 |
| 5,314,509 | 5/1994 | Kato et al. | 34/902 |
| 5,474,410 | 12/1995 | Ozawa et al. | 414/217 |
| 5,512,320 | 4/1996 | Turner et al. | 427/255 |
| 5,516,732 | 5/1996 | Flegal | 437/250 |
| 5,525,160 | 6/1996 | Tanaka et al. | 118/728 |
| 5,570,994 | 11/1996 | Somekh et al. | 414/786 |
| 5,609,689 | 3/1997 | Kato et al. | 118/719 |
| 5,647,724 | 7/1997 | Davis et al. | 414/744.5 |
| 5,730,574 | 3/1998 | Adachi et al. | 414/222 |
| 5,769,952 | 6/1998 | Komino | 118/733 |
| 5,778,968 | 7/1998 | Hendrickson et al. | 165/80.1 |

FOREIGN PATENT DOCUMENTS

WO 94/23911  10/1994  WIPO .

*Primary Examiner*—R. Bruce Breneman
*Assistant Examiner*—Jeffrey Lund
*Attorney, Agent, or Firm*—Perman & Green, LLP

[57] ABSTRACT

A substrate processing apparatus having a plurality of substrate processing modules connected to a substrate transport. The substrate transport has a housing and a substrate transport mechanism. The housing forms a substantially closed main transport chamber with doorways into the main transport chamber for the substrate processing modules. The transport mechanism has a substrate holder movably located in the transport chamber. The housing includes a front end extension that is connected to load locks. The front end extension has an aligner, a cooler, and a buffer directly connected to the housing and located in the front end extension in part of the main transport chamber.

45 Claims, 7 Drawing Sheets

SUBSTRATE PROCESSING APPARATUS HAVING A SUBSTRATE TRANSPORT WITH A FRONT END EXTENSION AND AN INTERNAL SUBSTRATE BUFFER

BACKGROUND OF THE INVENTION

1. Field of the Invention

The present invention relates to substrate processing and, more particularly, to movements of substrates with a substrate transport.

2. Prior Art

U.S. Pat. Nos. 5,013,385 and 5,512,320 disclose substrate processing modules attached to a substrate transport having a main vacuum transport chamber. It is known in the art to attach a substrate cooling module to a side of the substrate transport outside of the main transport chamber. It is known in the art to attach a substrate aligner to the substrate transport outside of the main transport chamber. It is known in the art to provide a substrate buffer in an atmospheric load/unload section outside of the main transport chamber. It is also known in the art to use substrates inside a substrate processing module during a cleaning operation of the module to cover a substrate chuck in the module.

SUMMARY OF THE INVENTION

In accordance with one embodiment of the present invention, a substrate processing apparatus is provided comprising a main section and substrate processing modules. The main section has a frame and a substrate transport mechanism connected to the frame. The frame forms a substantially closed main environment chamber therein. The substrate transport mechanism has a movable arm assembly located in the main chamber and a substrate holder connected to the movable arm assembly. The substrate transport mechanism is adapted to insert substrates into the substrate processing modules and remove the substrates from the substrate processing modules. The main section further comprises a substrate buffer station located in the main chamber which is adapted to hold a plurality of substrates, wherein a plurality of substrates are stored inside the main chamber at the buffer station.

In accordance with one method of the present invention, a method of moving substrates in a substrate processing apparatus is provided. The substrates include a dummy or cleaning operation substrate. The substrate processing apparatus has a substantially closed main transport chamber connected to the substrate processing modules and a robot for moving substrates between the transport chamber and the substrate processing modules. The method comprises steps of inserting the cleaning operation substrate into a first one of the substrate processing modules; performing a cleaning operation in the first substrate processing modules while the cleaning operation substrate is inside the first module; removing the cleaning operation substrate from the first substrate processing module; and storing the cleaning operation substrate in a buffer station located in the transport chamber. The step of storing stores the cleaning operation substrate with at least one other substrate in the buffer station. In an alternate method, a dummy substrate could be moved out of the main transport chamber rather than being stored in the buffer station after cleaning. In addition, the method could include storing the dummy substrate in the buffer station before the dummy substrate is inserted into the first substrate processing module.

In accordance with another embodiment of the present invention, a substrate transport for a substrate processing apparatus is provided. The substrate transport comprises a frame, a transport mechanism, and a substrate buffer station. The frame defines a main transport chamber and two access paths located between the main transport chamber and load lock mounting areas on the frame. The transport mechanism is connected to the frame and has a substrate holder movably located in the main transport chamber. The substrate buffer station is connected to the frame inside the main transport chamber. The substrate buffer station is located directly between the two access paths. Substrates can be stored directly between the two access paths in the buffer station without interfering with the movement of substrates through the access paths.

In accordance with another method of the present invention, a method of cleaning substrate processing modules in a substrate processing apparatus is provided. The substrate processing apparatus has a main transport chamber connected to the substrate processing modules and a robot for moving substrates between the main transport chamber and the substrate processing modules. The method comprises steps of performing a first cleaning operation in one of the substrate processing modules while a substrate is inside the module; removing the substrate from the cleaned substrate processing module; storing the substrate inside the main transport chamber while the cleaned substrate processing module processes other substrates; and subsequently inserting the substrate into one of the substrate processing modules for performing a second cleaning operation. The substrate used in the first cleaning operation is not moved out of the main transport chamber between multiple substrate processing module cleaning operations with the substrate.

In accordance with another embodiment of the present invention, a substrate transport for a substrate processing apparatus is provided comprising a housing, a substrate transport mechanism, and means for selectively connecting at least one substrate handler directly to the housing. The housing defines a substantially closed main transport chamber with doorways into the main transport chamber located at lateral sides of the housing. The substrate transport mechanism is connected to the housing and has a substrate holder movably located in the main transport chamber. The holder is movable by the substrate transport mechanism through the doorways in the housing. The means for selectively connecting can connect the substrate handler to the housing at two different alternative locations on the housing. The substrate handler is located inside the main transport chamber at one of the two different alternative locations.

In accordance with another embodiment of the present invention, a substrate transport for a substrate processing apparatus is provided comprising a housing, and a substrate transport mechanism connected to the housing. The housing defines a substantially closed main transport chamber with doorways into the main transport chamber located at lateral sides of the housing. The substrate transport mechanism has a substrate holder movably located in the main transport chamber. The holder is movable by the substrate transport mechanism through the doorways in the housing. The frame has a front end extension which extends as a general outwardly expanding wedge shape of about 80°. At least one substrate access path from a load lock mounting area on the housing into a center area of the main transport chamber extends through the front end extension.

BRIEF DESCRIPTION OF THE DRAWINGS

The foregoing aspects and other features of the invention are explained in the following description, taken in connection with the accompanying drawings, wherein.

DETAILED DESCRIPTION OF THE PREFERRED EMBODIMENT

Figure 1:
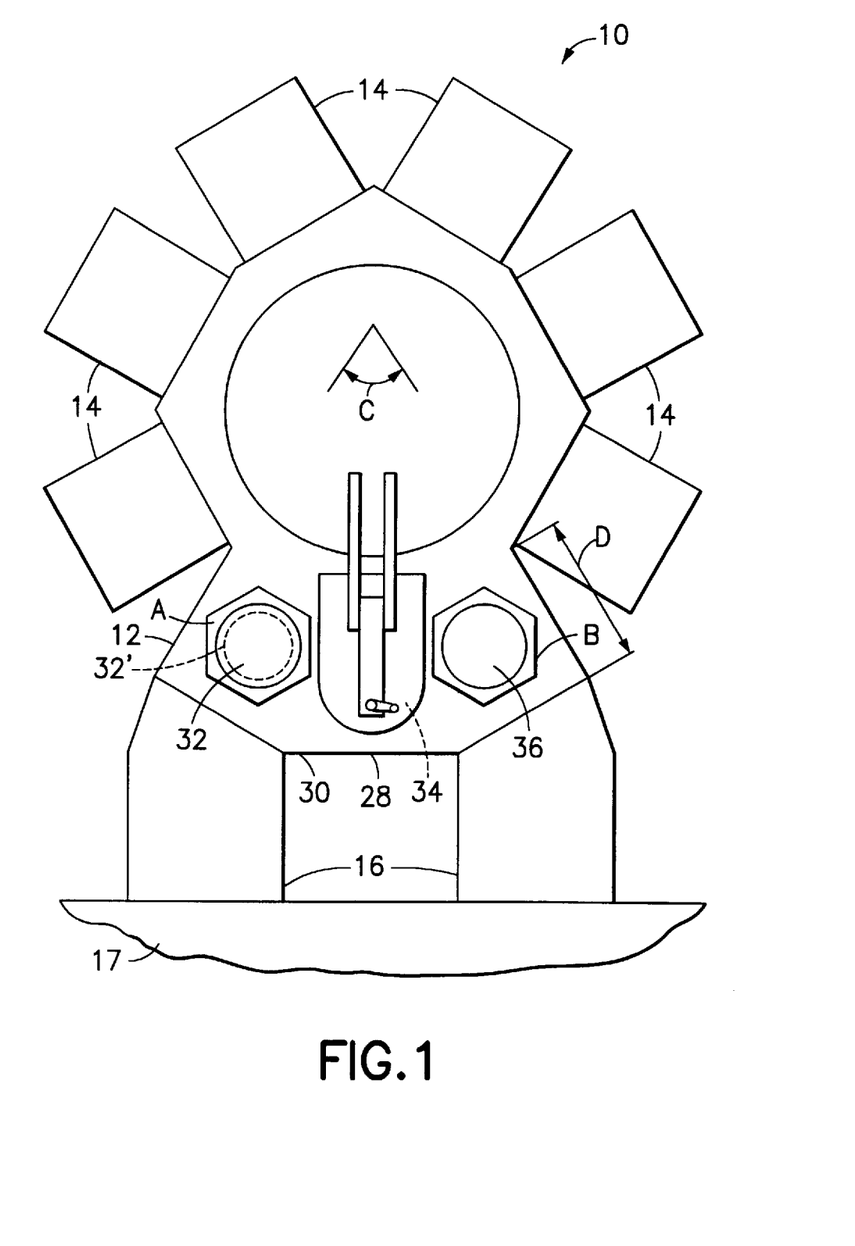
FIG. 1 is a top plan view of a substrate processing apparatus incorporating features of the present invention.

Referring to FIG. 1, there is shown a schematic top plan view of a substrate processing apparatus 10 incorporating features of the present invention. Although the present invention will be described with reference to the single embodiment shown in the drawings, it should be understood that the present invention can be embodied in many alternate forms of embodiments. In addition, any suitable size, shape or type of elements or materials could be used.

Figure 2:
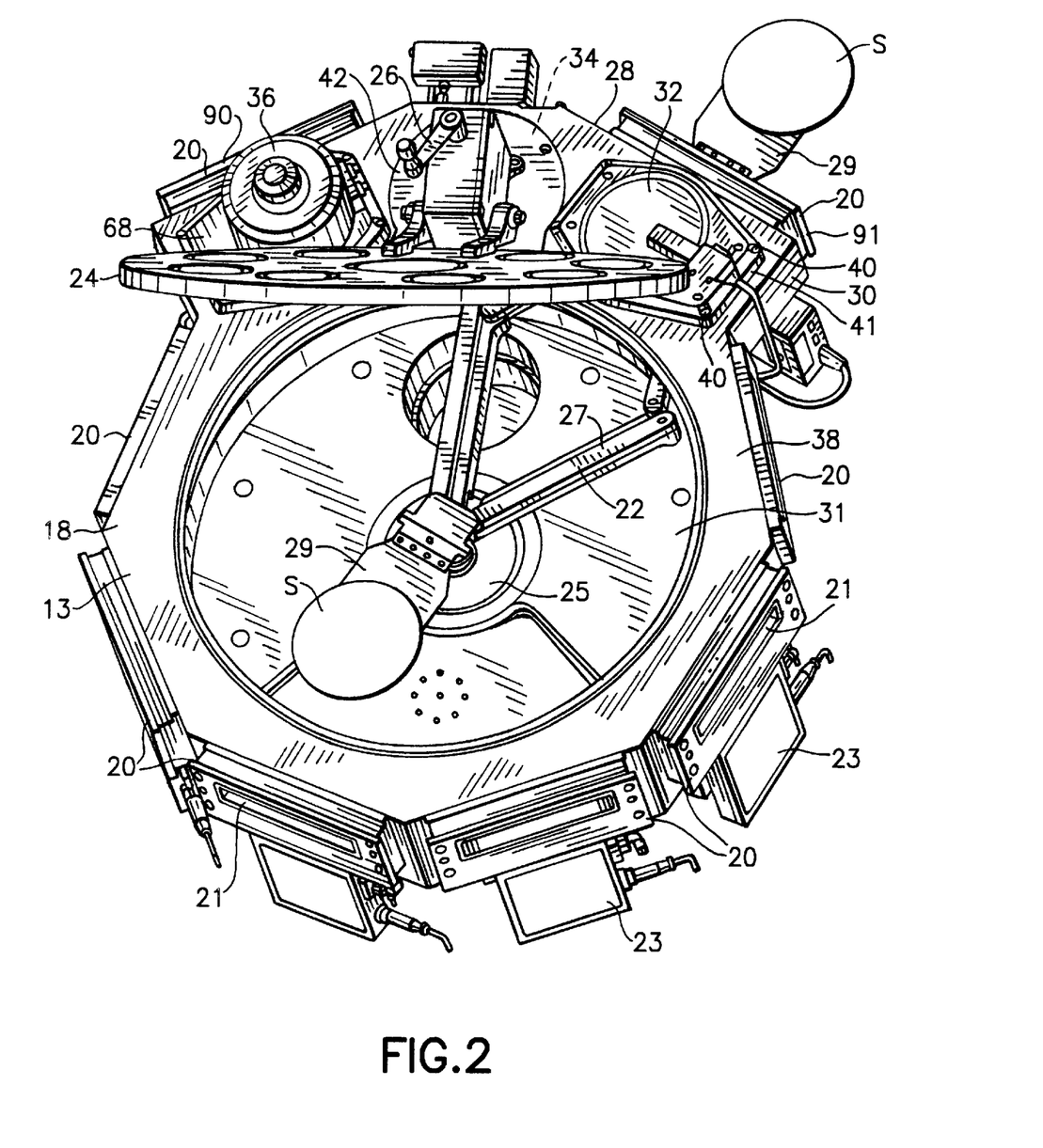
FIG. 2 is a perspective view of the main section of the apparatus shown in FIG. 1.
Figure 3:
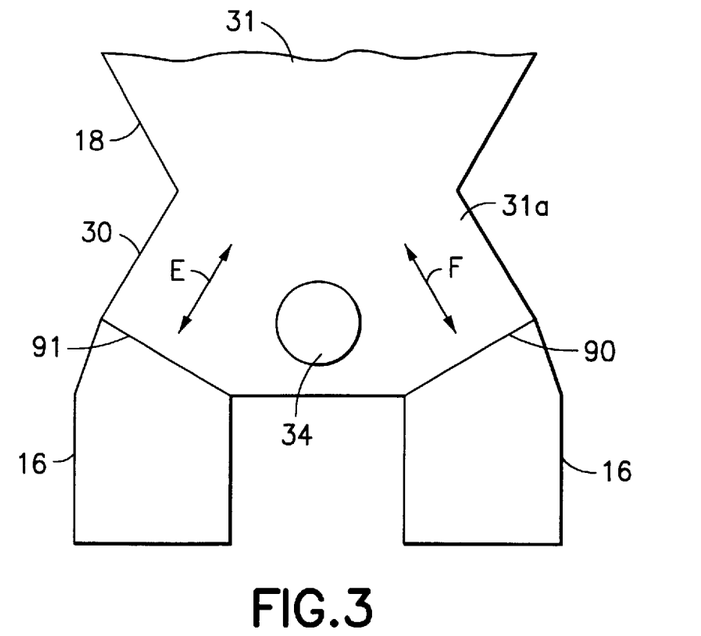
FIG. 3 is a schematic view of the front end of the main section shown in FIG. 2 attached to two load locks.

The apparatus 10 includes a main section 12, substrate processing modules 14, substrate load lock modules 16, and an atmospheric section 17. The atmospheric section 17 includes means for holding cassettes of substrates and a robot (not shown) for moving the substrates into and out of the load locks 16. In alternate embodiments, any suitable substrate loading system, manual and/or automatic computer controlled, could be used for loading substrates into the load locks 16. Referring also to FIG. 2, a perspective view of the main section 12 is shown. The cover 24 is shown in an up position for illustration purposes. During normal operation, the cover 24 is closed and sealed on top of the frame 18. The main section 12 is a substrate transport having a housing 13 and a substrate transport mechanism 22. The housing 13 has a frame 18 with multiple side apertures having door sections 20. The modules 14, 16 are connected to the door sections 20. The door sections 20 have doorways 21 with movable door mechanisms 23 to open and close the doorways. The substrate processing modules 14 and the load lock modules 16 are well known in the art. The substrates S could be semi-conductor wafers, flat panel display substrates, or any other type of substrate. The substrate transport mechanism 22 is provided for moving the substrates S among the modules 14, 16. The substrate transport mechanism 22 has a drive section 25, a movable arm section 27 and two substrate holders 29. The holders 29 can be moved through the doorways 21 into and out of the modules 14, 16 to move the substrate S into and out of the modules 14, 16. A similar substrate transport mechanism is described in PCT patent publication No. WO 94/23911 which is hereby incorporated by reference in is entirety. However, any suitable type of substrate transport mechanism can be used. The housing 13 includes a movable top cover 24 and a cover movement crank 26. The front end 28 of the housing 13 has an extended section 30. The term "front end" is used merely for descriptive purposes. The extended section could be located on any side of the housing, could be spaced from paths to and from the load locks, and/or could comprise multiple extended sections. The section 30 holds a substrate holding buffer 32 and two substrate handlers. In the embodiment shown, one of the substrate handlers is a substrate aligner 32 and the other substrate handler is a substrate cooler 36. In alternate embodiments the substrate handlers could include a substrate degas/pre-heater, a combined substrate heater/cooler, a multiple substrate heater, cooler or heater/cooler, or any other suitable type of substrate handler. The front extended section 30 has a general outwardly expanding wedge shape extending towards the front of the frame 18 at a path of about 80° as seen by angle C in FIG. 1. However, any suitable angle C could be provided and different shapes for the front end extended section could be provided. The 80° wedge shape has been selected to allow the nearby substrate processing modules 14 to be angled and positioned as shown. This helps to orientate all of the substrate processing modules at efficient locations and spacings with the main section 12. The front extended section 30 is preferably integrally formed with the rest of the frame 18 and is not removable from the rest of the frame. However, in an alternate embodiment the front extended section could be separate pieces removably connected to the rest of the frame 18. What is desired is that the front extended section 30 have a chamber that is unitary with the main chamber 31 without the need of movable doors between the two chambers. In an alternate embodiment, such as if the substrate handler(s) 32, 36 and/or buffer 34 are in the main chamber 31, the front extended section 30 need not be provided. The general length D of the front extended section 30 is sufficiently short to allow the movable arm section 27 of the transport mechanism 22 to pass through the extended section 30 into the load locks 16. However, the general length D is sufficiently long to mount the aligner 32, buffer 34 and cooler 36. The housing 13 forms a main transport chamber 31 therein. The main transport chamber 31 has the movable arm section 27 therein and the doorways 21 are located at the outer perimeter of the chamber 31. The chamber 31 is maintained as a substantially closed environment. The doors at the doorways 21 can be temporarily opened for inserting and removing substrates with the modules 14, 16. Preferably, the main chamber 31 is maintained in a vacuum. However, the main chamber 31 could alternatively be filled with an inert gas. Referring also to FIG. 3, the front extended section 30 has a front end chamber 31a that is part of the main chamber 31. The frame 18 has two load lock mounting areas 90, 91 at its front end. The front end chamber 31a forms two substrate access paths E, F from the load locks 16 to the center area of the main chamber 31. The buffer 34 is located in the front end chamber 31a directly between the two access paths E, F. In an alternate embodiment, the buffer 34 could be located in the front end chamber 31a, but not directly between the two access paths E, F, such as if only one access path is provided through the chamber 31a, or if the two access paths are located next to each other and the buffer is located next to only one of the access paths.

Figure 4:
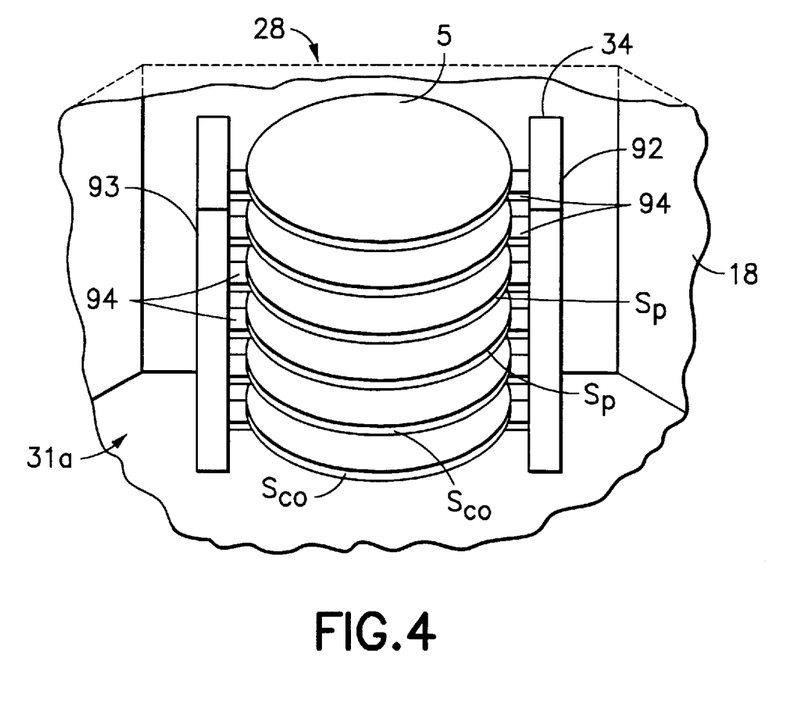
FIG. 4 is a partial cut-away perspective view of the buffer station inside the main section shown in FIG. 2.

The buffer 34 is located directly between the aligner 32 and the cooler 36. The buffer can hold one or more substrates while waiting for the mechanism 22 to move the substrate(s) into one of the modules 14, 16. However, the buffer 34 need not be provided. Referring also to FIG. 4, a perspective view of the buffer 34 is shown. In this embodiment, the buffer 34 is adapted to hold six substrates in a spaced stacked configuration. However, in alternate embodiments the buffer could be adapted to hold more or less than six substrates. In the embodiment shown, the buffer 34 is a stationary buffer station with two spaced stands 92, 93. Cantilevered support arms 94 extend inward towards each other from the stands 92, 93. The support arms 94 have standoffs on their top side to support the substrates thereon. In alternate embodiments other configurations could be provided to store substrates in the buffer. The buffer could also be movable, such as with an elevator. However, in a preferred embodiment the buffer is stationary such that the buffer is easy to access if necessary. The substrate transport mechanism 22 is adapted to vertically move the movable arm section 27 and holders 29. Thus, the substrate transport mechanism 22 can insert substrates into and remove substrates from the six different levels of substrate holding areas in the buffer 34 shown in FIG. 4. The holders 29 merely extend between the two stands 93, 94 to pick up or drop off the substrates. The buffer 34 is located out of the two access paths E, F and, just as importantly, does not interfere with the proper operation of the aligner 32 and the cooler 36. The aligner 32 is used to align the substrates as is known in the art. In this embodiment the aligner 32 is a modular drop-in unit that is inserted into the frame 18 through a hole in the top surface 38 of the frame 18. Four screws 40 are then used to fix a mounting flange 41 of the aligner 32 to the frame 18. The aligner 32 has a movable portion or substrate support 32' located in the chamber 31a. The substrates are placed on the support 32' and rotated with the support 32' to orientate or align the substrates. Because the movable support of the aligner is located in the chamber 31, the aligner can align a substrate without moving the substrate out of the main transport chamber 31. The crank 26 is mounted to the frame 18 by a plate 42. The plate 42 is located over the buffer 34. The plate 42 can be removed from the frame 18 to allow a user to gain access to the buffer. In alternate embodiments, the buffer and/or one or more of the substrate handlers could be located in the main chamber 31, but not necessarily in the extension chamber 31a. However, the use of the front extension 30 is preferred because it provides a small footprint for the main section 12 with a buffer and two substrate handlers that was previously not available. This small footprint allows the apparatus 10 to take up less space on a manufacturing factory floor and, thus, can save the manufacturer money or allow a larger number of the apparatus 10 to be located in a given floor space than with larger prior art apparatus. The extension chamber 31a and/or any other part of the chamber 31 could have more than two substrate handlers.

Figure 5A:
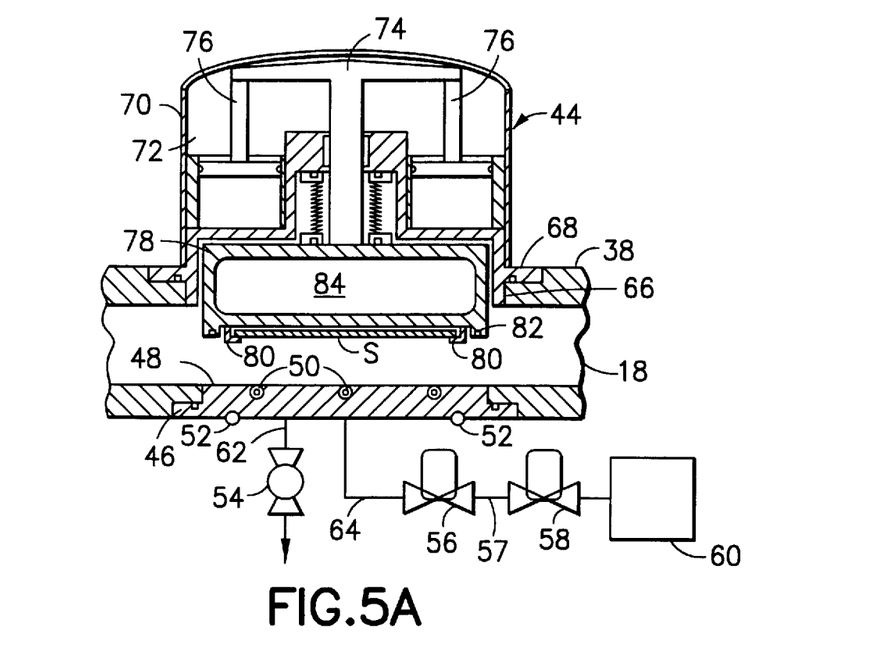
FIG. 5A is a schematic cross sectional view of the cooler in an up position.

Referring also to FIG. 5A, the cooler 36 comprises a top unit 44 and a bottom unit 46. The bottom unit 46 comprises a heat transfer plate 48 with standoffs 50 and coolant passages 52. The plate 48 is connected by a rough out valve 54 to a source of vacuum. The plate 48 is also connected by a backfill valve 56 and a charging valve 58 to a source of inert gas 60. The backfill valve 56 and the changing valve 58 have a conduit 57 between them that forms a gas metering area. Conduits 62, 64 extend to the top surface of the heat transfer plate 48.

Figure 5B:
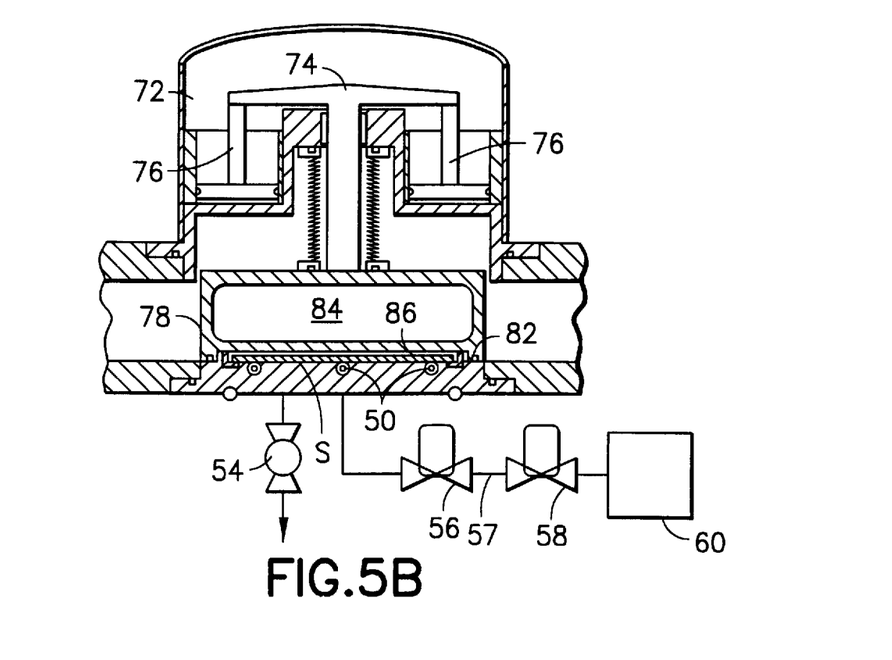
FIG. 5B is a schematic cross sectional view of the cooler in a down position.

The top unit or poppet mechanism 44 is a modular drop-in unit that is inserted into the frame 18 through the hole 66 in the top surface 38. Four screws are then used to fix the mounting flange 68 to the frame 18. The mounting flange 68 is the same size and shape as the aligner's mounting flange 41. The frame 18, aligner 32 and cooler 36 have been constructed such that the frame 18 can accept either the aligner 32 or the cooler 36 at the two locations A and B (See FIG. 1). Thus, the main section 12 could have two aligners or two coolers, or the aligner and cooler could be located at opposite sides. This modular construction allows the manufacturer to relatively easily configure the apparatus 10 to specific requirements. If no cooler and/or aligner is needed in the main section 12, sealing plates (not shown) need only be connected to the frame 18 in place of the cooler and/or aligner. Another important advantage is that, because of their drop in assembly, the top of the aligner 32 and the top unit 44 of the cooler 36 can be easily removed from the top side of the main section 12 by merely removing their four mounting screws. This allows quick and easy access in the aligner and cooler, if a wafer becomes broken, in order to clean out the broken wafer. The top unit 44 includes a cover 70, a frame 72, and a moving support 74. The frame 72 is stationarily connected to the frame 18. The moving support 74 has drive sections 76 and a lower support 78. Referring also to FIG. 5B, the drive section 76 can be moved up and down relative to the frame 72, such as by hydraulics or pneumatics, to move the moving support 74 up and down. FIG. 5A shows the support 74 in an up position for loading or unloading a substrate. FIG. 5B shows the support 74 in a down position for cooling a substrate.

The lower support 78 has substrate support arms 80, a seal 82, and a pass through hole 84. In the up position shown in FIG. 5A, a substrate S can be loaded onto or removed from the arms 80 by the transport mechanism 22. In the down position shown in FIG. 5B, the transport mechanism 22 can pass through the hole 84 to extend into the module 16. When the lower support 78 is moved down, the seal 82 engages the top surface of the lower unit 46 to form a small enclosed chamber 86. The substrate S is placed on the standoffs 50 in the chamber 86. The inert gas is then introduced into the chamber 86 for gas assisted cooling of the substrate S. In alternate embodiments other types of coolers could be provided or, no cooler need be provided in the front extended section 30, such as if a separate cooler module is attached to the frame 18 or if no cooler is needed.

As is known in the art, substrate processing chambers need to periodically perform a cleaning operation. For example, CVD (chemical vapor disposition) substrate processing modules and PVD (physical vapor disposition) substrate processing modules, such as those that use sputtering, need to be periodically cleaned. This comprises placing a cleaning operation substrate, also known as a dummy, test or sacrificial substrate, on the substrate chuck in the module and performing the cleaning operation. The cleaning operation for a CVD module comprises using very high temperature to bake the CVD chamber clean; similar to a self-cleaning oven. The cleaning operation substrate is placed in the substrate processing module during this cleaning operation to protect the substrate chuck in the module.

The present invention uses the buffer 34 to store the cleaning operation substrates between cleaning operations. In a preferred embodiment, the buffer 34 holds a cleaning operation substrate for each one of the processing modules 14 directly connected to the main section 12. Preferably, each cleaning operation substrate is only used with one of the modules 14. Thus, it is relatively easy to calculate when each cleaning operation substrate should be replaced based upon how many cleaning operations its respective module 14 has undergone. However, in alternate embodiments, the number of cleaning operation substrates may be less than the total number of modules 14 and cleaning operation substrates can be used in more than one module 14.

Figure 6:
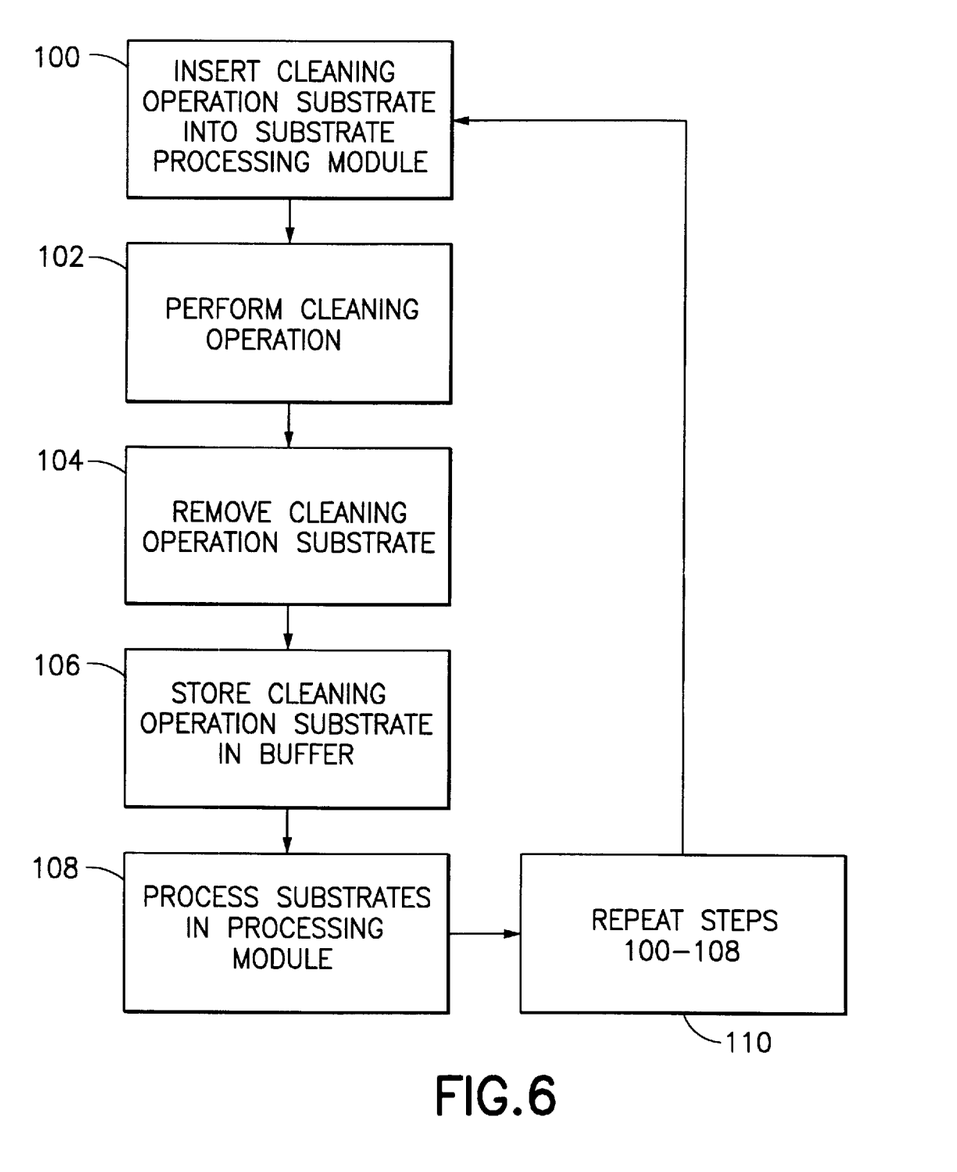
FIG. 6 is a block diagram of the method of moving the cleaning operation substrate.

Referring now to FIG. 6, the method of moving the cleaning operation substrates will be described. The cleaning operation substrates are first loaded into the main section 12. This initial loading could be manual or moved by robot with a computer control. The substrate can be directly inserted into one of the substrate processing modules 14, such as at the start of the apparatus 10, or stored in the buffer 34 until needed. After the substrate is inserted into the substrate processing module to be cleaned as indicated by block 100, the cleaning operation is performed as indicated in block 102. When the cleaning operation is completed, the substrate is removed from the module as indicated by block 104 and stored in the buffer 34 as indicated in block 106. The newly cleaned substrate processing module is then used to process substrates as indicated by block 108. When the substrate processing module needs to be cleaned again, steps 100–108 are repeated as indicated by block 110. This same process would be repeated for each of the substrate processing modules that need periodic cleaning. Of course, several processing modules can be cleaned simultaneously with different dummy/cleaning substrates. A single dummy/cleaning substrate could also be used to clean multiple substrate processing modules.

The buffer 34, in addition to storing cleaning operation substrates, may also be used to store regular process substrates between location of the process substrates among modules 14, aligner 32 and/or cooler 36. The term "regular process substrate" is intended to mean a substrate in which at least a portion will eventually be used in the final product. The term "cleaning operation substrate" is intended to mean a substrate other than a regular process substrate. Such a cleaning operation substrate is not necessarily limited to use in cleaning of processing modules, but may be used for additional and/or alternative functions. As seen in FIG. 4, the buffer 34 can hold both cleaning operation substrates $S_{co}$ and regular process substrates $S_p$. The process substrates $S_p$ can be stored in empty holding areas while the cleaning operation substrate normally in that holding area is being used in a cleaning operation. Alternatively, the buffer 34 can have predesignated holding areas for the regular process substrates in addition to the holding areas for the total number of cleaning operation substrates. Thus, the buffer can hold both cleaning operation substrates and regular process substrates at the same time.

Figure 7:
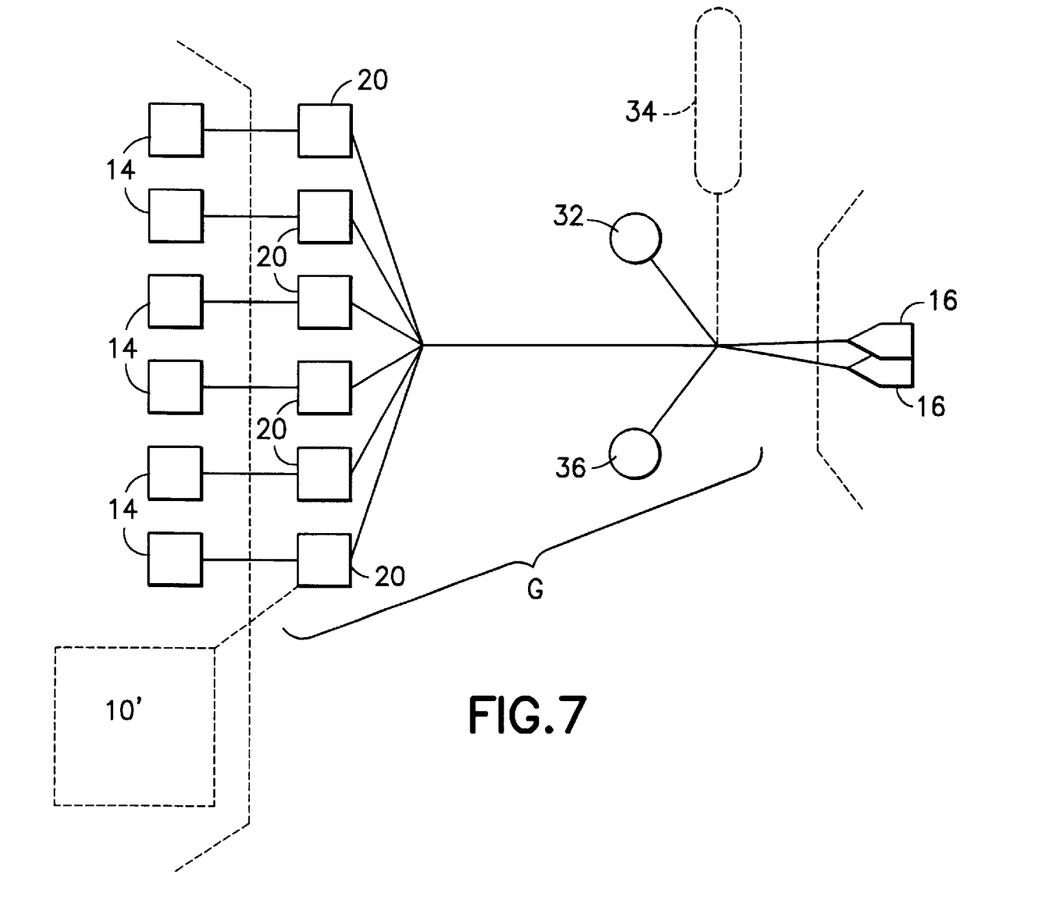
FIG. 7 is a flow diagram showing possible movements by the transport mechanism to various locations.

Referring now also to FIG. 7, a schematic diagram showing possible paths of movement of substrate among the various stations is shown. As noted above, the buffer 34 need not be provided. Therefore, the buffer is shown in dotted lines. The apparatus 10 can also be operationally connected in series to another apparatus 10'. G indicates all the movements that a substrate can make in the apparatus 10 without leaving the main section 12. By merely properly programming the apparatus computer controller, any suitable path of a substrate anywhere in the solid connecting lines of G can be provided. For example, a process substrate can be processed in a first substrate processing module, moved to the aligner, and moved to a second processing module for further processing. In another example, a process substrate can be processed in a first substrate processing module, moved to the cooler for cooling, and then moved to another substrate processing module, or the aligner and then the other module, or merely returned to the load lock. The variations of possible substrate movements are numerous. However, with the present invention, the substrates can be moved to the aligner 32, buffer 34 and cooler 36 without leaving the chamber 31. Additional or fewer stations could be provided inside the chamber 31. Thus, additional or fewer available pathways and movement sequences could be provided in the chambers 31.

Figure 8:
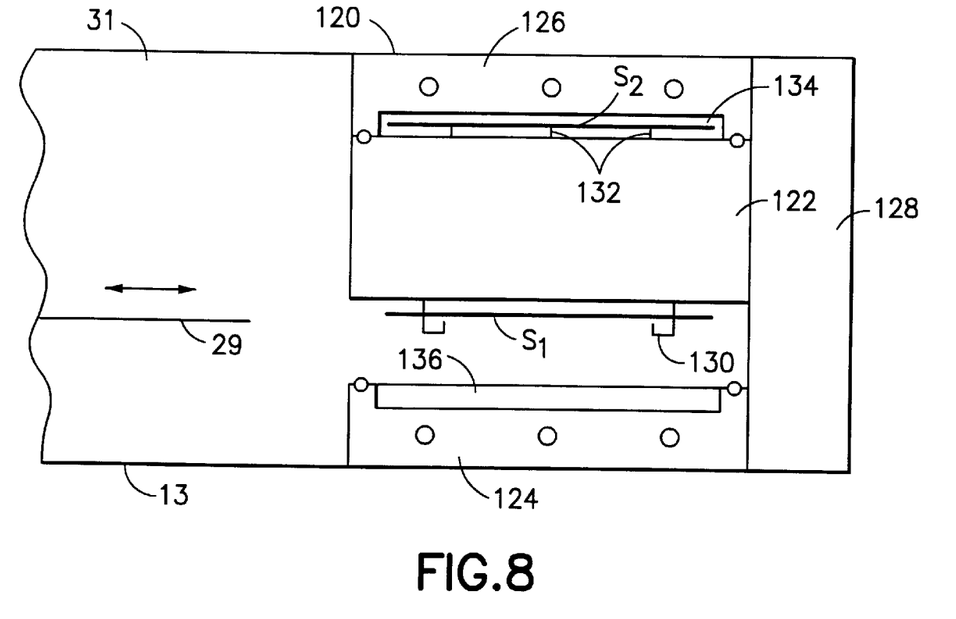
FIG. 8 is a schematic view of an alternate embodiment of a substrate handler inside the main transport chamber.

Referring now to FIG. 8, an alternate embodiment of a substrate handler is shown located inside the main transport chamber 31, but not in an extension. The handler 120 is a dual heat transfer unit for the substrates. The handler 120 has a movable substrate support 122, a bottom heat transfer member 124, a top heat transfer member 126 and a drive 128. The drive 128 is adapted to move the support 122 up and down. The bottom of the support 122 has support arms 130 for supporting a substrate $S_1$ thereon. The top of the support 122 has standoffs 132 for supporting a second substrate $S_2$ thereon. The support 122 is shown in an up position. In this position the substrate holder 29 can place the substrate $S_1$ directly on the support arms 130 or remove the substrate $S_1$ from the support arm 130. The second substrate $S_2$ is located in a closed chamber 134 formed by the support 122 and the top heat transfer member 126. When the support 122 is moved to a down position by the drive 128, the substrate $S_1$ is sealed in a chamber 136 formed by the support 122 and the bottom heat transfer member 124. In the down position the second substrate $S_2$ can be inserted or removed on the standoffs 132 by the substrate holder 29. The two heat transfer members could both be cooling plates, or heating plates, or a combination of one heating plate and one cooling plate. In an alternate embodiment the substrate handler 29 could be sized and shaped to supply heat transfer to move than two substrates at the same time. The heat transfer units could each also be a combined heater/cooler unit. However, one of the unique features of this embodiment is that multiple substrates can be cooled and/or heated in a single unit which allows the substrates to be inserted in the unit without the substrate holder 29 leaving the main transport chamber. The unit 120 is directly connected to the housing 13 and the movable support 122 is located, at least partially, inside the main transport chamber. One substrate can be inserted or removed from the unit 120 while the other substrate remains in the unit 120.

It should be understood that the foregoing description is only illustrative of the invention. Various alternative and modifications can be devices by those skilled in the art without departing from the invention. Accordingly, the present invention is intended to embrace all such alternative, modifications and variances which fall within the scope of the appended claims.

What is claimed is:

1. A substrate processing apparatus comprising:
   a main section having a frame and a substrate transport mechanism connected to the frame, the frame forming a substantially closed main environment chamber therein, the substrate transport mechanism having a movable arm assembly located in the main chamber and a substrate holder connected to the movable arm assembly; and
   substrate processing modules connected to the frame, the substrate transport mechanism being adapted to insert substrates into the substrate processing modules and remove the substrates from the substrate processing modules,
   wherein the main section further comprises a substrate buffer station located in the main chamber adapted to hold a plurality of substrates, wherein a plurality of substrates are stored inside the main chamber at the buffer station, and wherein the buffer station is stationarily connected to the frame.

2. An apparatus as in claim 1 wherein the buffer station is adapted to hold the plurality of substrates in a stacked configuration.

3. An apparatus as in claim 2 wherein the main section has two access paths between the main chamber and two load locks connected to the main section, and wherein the buffer station is located directly between the two access paths.

4. An apparatus as in claim 2 wherein the substrate transport mechanism vertically moves the substrate holder to insert and remove substrates from different levels of the buffer station.

5. An apparatus as in claim 1 wherein the frame has a movable cover with a cover movement mechanism located directly above the buffer station.

6. An apparatus as in claim 1 wherein the main section has a front end with an extended section attached to a load lock, wherein the buffer station is located in the extended section next to a substrate handling unit located in the extended section.

7. An apparatus as in claim 6 wherein the substrate handling unit is a substrate aligner.

8. An apparatus as in claim 6 wherein the substrate handling unit is a substrate cooler.

9. An apparatus as in claim 6 wherein the extended section includes two substrate handling units.

10. A method of moving substrates in a substrate processing apparatus, the substrates including a cleaning operation substrate, the substrate processing apparatus having a substantially closed transport chamber connected to at least one substrate processing module and a robot for moving substrates between the transport chamber and the at least one substrate processing module, the method comprising steps of:
  inserting the cleaning operation substrate into a first one of the at least one substrate processing modules;
  performing a cleaning operation in the first substrate processing module while the cleaning operation substrate is inside the first module;
  removing the cleaning operation substrate from the first substrate processing module; and
  storing the cleaning operation substrate in a buffer station located in the transport chamber, wherein the step of storing stores the cleaning operation substrate with at least one other substrate in the buffer station.

11. A method as in claim 10 wherein the step of storing the cleaning operation substrate in the buffer station comprises storing a number of total substrates in the buffer station greater than or equal to a total number of substrate processing modules directly connected to the main transport chamber.

12. A method as in claim 10 further comprising storing a substrate, which is not located in the substrate processing modules during cleaning operations, temporarily in the buffer station after the substrate has been processed in one of the substrate processing modules.

13. A method as in claim 12 wherein the step of storing stores both the cleaning operation substrate and another substrate, which is not located in any of the substrate processing modules during their respective cleaning operations, in the buffer station at the same time.

14. A method as in claim 10 further comprising inserting the cleaning operation substrate into only the first substrate processing module and no other substrate processing modules during cleaning of the respective substrate processing modules.

15. A method as in claim 14 wherein each substrate processing modules has its own respective cleaning operation substrate stored in the buffer such that each cleaning operation substrate is only inserted into its respective substrate processing module and no other substrate processing module.

16. A method as in claim 10 further comprising inserting substrates, which are to be processed in the substrate processing modules, into the transport chamber along an entry passageway path directly beside the buffer station.

17. A method as in claim 10 further comprising aligning substrates in an aligner beside the buffer station.

18. A method as in claim 17 further comprising cooling a substrate in a cooler located beside the buffer station.

19. A method as in claim 10 further comprising cooling a substrate in a cooler located beside the buffer station.

20. A substrate transport for a substrate processing apparatus, the substrate transport comprising:
  a frame defining a main transport chamber and two access paths between the main transport chamber and load lock mounting areas on the frame;
  a transport mechanism connected to the frame and having a substrate holder movably located in the main transport chamber; and
  a substrate buffer station connected to the frame inside the main transport chamber, the substrate buffer station being located directly between the two access paths, wherein substrates can be stored directly between the two access paths in the buffer station without interfering with the movement of substrates through the access paths.

21. A substrate transport as in claim 20 wherein one of the access paths has an aligner mounted to the frame for aligning substrates at that access path, wherein the aligner is located next to the buffer station.

22. A substrate transport as in claim 20 wherein one of the access paths has a cooler mounted to the frame for cooling substrates, wherein the cooler is located next to the buffer station.

23. A substrate transport as in claim 20 further comprising two substrate handling units mounted to the frame at the two access paths for moving substrate next to the buffer station.

24. A substrate transport as in claim 23 wherein the two substrate handling units are interchangeably mounted to the frame at the two access path, wherein the configuration of the two substrate handling units on the frame is selectably configurable.

25. A substrate transport as in claim 24 wherein the two substrate handling unit comprise an aligner and a cooler.

26. A substrate transport as in claim 20 wherein the frame has a front end extension extending along a path of about 80° towards a front of the frame, wherein the buffer station and two access paths are located in the front end extension.

27. A method of cleaning substrate processing modules in a substrate processing apparatus, the substrate processing apparatus having a main transport chamber connected to the substrate processing modules and a robot for moving substrates between the main transport chamber and the substrate processing modules, the method comprising steps of:
  performing a first cleaning operation in one of the substrate processing modules while a substrate is inside the module;
  removing the substrate from the cleaned substrate processing module;
  storing the substrate inside the main transport chamber while the cleaned substrate processing module processes other substrates; and
  subsequently inserting the substrate into one of the substrate processing modules for performing a second cleaning operation, wherein the substrate used in the first cleaning operation is not moved out of the main transport chamber between multiple substrate processing module cleaning operations with the substrate.

28. A method as in claim 27 wherein the substrate is only inserted into one of the substrate processing modules during its cleaning operation and into no other substrate processing module during their respective cleaning operations.

29. A method as in claim 27 wherein the step of storing comprises storing the substrate in a stationary multi-substrate holding buffer located inside the main transport chamber.

30. A method as in claim 29 wherein the step of storing holds multiple substrates in the buffer with one substrate being provided and used from the buffer for cleaning operations in each respective substrate processing module.

31. A method as in claim 29 wherein the step of storing stores the substrate in the buffer with another substrate that is not located in any of the substrate processing modules during their respective cleaning operations.

32. A substrate transport for a substrate processing apparatus, the substrate transport comprising:

a housing defining a substantially closed main transport chamber with doorways into the main transport chamber located at lateral sides of the housing;

a substrate transport mechanism connected to the housing and having a substrate holder movably located in the main transport chamber, the holder being movable by the substrate transport mechanism through the doorways in the housing; and means for selectably connecting at least one substrate handler directly to the housing at two different interchangeable alternative locations on the housing, the substrate handler being located inside the main transport chamber.

33. A substrate transport as in claim 32 wherein the substrate handler is a substrate aligner.

34. A substrate transport as in claim 32 wherein the substrate handler is a substrate cooler.

35. A substrate transport as in claim 32 wherein the means for selectably connecting comprises means for connecting two substrate handlers at the two different locations.

36. A substrate transport as in claim 35 wherein the two substrate handlers are different types of substrate handlers and are interchangeably mountable to the housing at the different locations to provide different configurations.

37. A substrate transport for a substrate processing apparatus, the substrate transport comprising:

a housing defining a substantially closed main transport chamber with doorways into the main transport chamber located at lateral sides of the housing; and a substrate transport mechanism connected to the housing and having a substrate holder movably located in the main transport chamber, the holder being movable by the substrate transport mechanism through the doorways in the housing, wherein the frame has a front end extension extending as a general outwardly expanding wedge shape along a path of about 80°, and wherein at least one substrate access path from a load lock mounting area of the housing into a center area of the main transport chamber extends through the front end extension.

38. A substrate transport as in claim 37 wherein a front end of the front end extension has two spaced load lock mounting areas.

39. A substrate transport as in claim 37 further comprising at least one substrate handing unit directly connected to the housing at the front end extension at the substrate access path.

40. A substrate transport as in claim 39 wherein the front end extension has two spaced substrate access paths therethrough, and wherein the two substrate access paths are unitarily formed by the housing as part of the main transport chamber.

41. A substrate transport as in claim 37 further comprising a substrate buffer station located in the front end extension.

42. A substrate transport as in claim 41 wherein the buffer station is sized and shaped to hold a plurality of substrates.

43. A method of moving substrates in a substrate processing apparatus, the substrate processing apparatus having a transport chamber connected by a doorway to at least one substrate processing chamber and a robot for moving substrates between the transport chamber and the substrate processing chamber, the method comprising steps of:

storing a dummy substrate in a buffer station located in the transport chamber, the step of storing comprising storing the dummy substrate with at least one other substrate in the buffer station at the same time; and moving the dummy substrate from the buffer station into the substrate processing chamber by the robot while the at least one other substrate is left in the buffer station.

44. A method as in claim 43 further comprising cleaning the substrate processing chamber while the dummy substrate is located inside the substrate processing chamber.

45. A method of moving substrates in a substrate processing apparatus, the substrate processing apparatus having a vacuum transport chamber connected by a doorway to a substrate processing chamber and a robot for moving substrates between the transport chamber and the substrate processing chamber, the method comprising steps of:

moving a dummy substrate from the substrate processing chamber by the robot to a substrate buffer station located in the transport chamber; and storing the dummy substrate in the substrate buffer station with at least one other substrate already in the buffer station, wherein the robot accesses different levels of the buffer station inside the vacuum transport chamber to individually move the substrates into and out of the buffer station.

* * * * *